United States Patent

Yamane et al.

[11] Patent Number: 5,523,843
[45] Date of Patent: Jun. 4, 1996

[54] POSITION DETECTING SYSTEM

[75] Inventors: Yukio Yamane; Kazuya Ono, both of Yokohama, Japan

[73] Assignee: Canon Kabushiki Kaisha, Tokyo, Japan

[21] Appl. No.: 118,358

[22] Filed: Sep. 9, 1993

Related U.S. Application Data

[63] Continuation of Ser. No. 726,277, Jul. 5, 1991, abandoned.

[30] Foreign Application Priority Data

Jul. 9, 1990 [JP] Japan ..................................... 2-179559

[51] Int. Cl.$^6$ ....................................................... G01B 9/02
[52] U.S. Cl. ........................................... 356/363; 356/358
[58] Field of Search ................................... 356/363, 345, 356/350, 360, 358

[56] References Cited

U.S. PATENT DOCUMENTS

| | | | |
|---|---|---|---|
| 3,692,413 | 9/1972 | Marcy et al. ............................ | 356/358 |
| 4,676,630 | 6/1987 | Matsushita et al. ..................... | 355/53 |
| 4,869,481 | 9/1989 | Yabu et al. ............................... | 269/21 |
| 4,984,891 | 1/1991 | Miyazaki et al. ........................ | 356/363 |
| 5,040,431 | 8/1991 | Sakino et al. ............................ | 74/479 |
| 5,114,234 | 5/1992 | Otsuka et al. ........................... | 356/363 |

*Primary Examiner*—Samuel A. Turner
*Attorney, Agent, or Firm*—Fitzpatrick, Cella, Harper & Scinto

[57] ABSTRACT

A system for detecting yawing of an article movable in first and second orthogonal directions along a plane includes a first yawing detecting device for detecting any angular change of a first surface of the article opposed to the first yawing detecting device, during movement of the article in the first direction; and a second yawing detecting device for detecting any angular change of a second surface of the article different from the first surface and opposed to the second yawing detecting device, during movement of the article in the second direction.

22 Claims, 5 Drawing Sheets

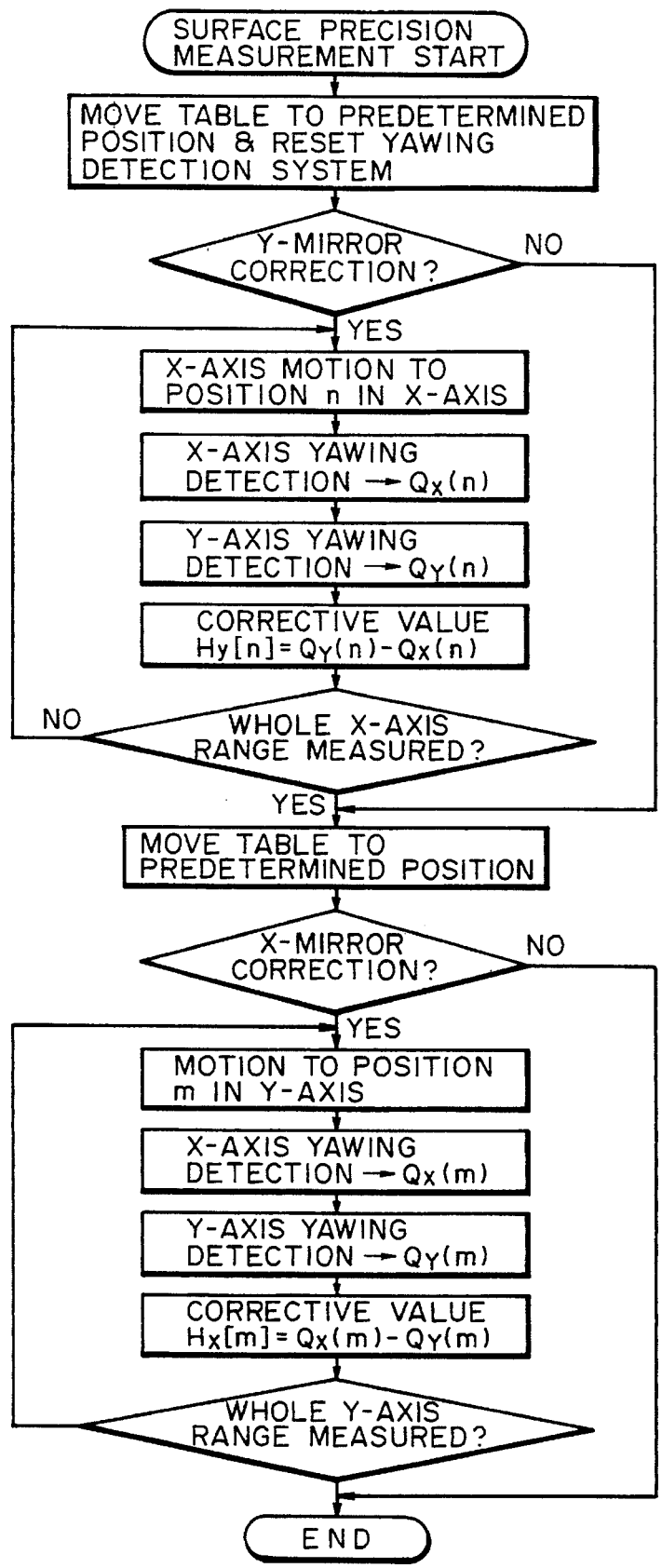
F I G. 3

POSITION DETECTING SYSTEM

This application is a continuation of Ser. No. 07/726,277, filed Jul. 5, 1991, now abandoned.

FIELD OF THE INVENTION AND RELATED ART

This invention relates generally to an exposure apparatus for forming patterns on a planar article such as a semiconductor wafer or a substrate of a liquid crystal panel display. More particularly, the invention is concerned with a position detecting system or a positioning system suitably usable in such an exposure apparatus for the manufacture of high degree integration circuit chips such as semiconductor memories or computing elements, for example, to accurately hold the attitude of an article, to be exposed, such as a wafer on which circuit patterns are to be printed, to thereby ensure high precision lithography.

Conventionally, the positioning of a movable table (called "X-Y stage") in such an exposure apparatus uses two laser beams in X and Y axes, respectively. Also, it is known that an additional laser beam is projected to one side of the table, parallel to one of the two laser beams, for detection of a yawing (rotational) displacement component. On the basis of values detected through the one set of (two) laser beams, the detection and control of the yawing displacement component of the table during its movement along the X-Y plane is carried out. This is disclosed in U.S. Pat. No. 4,676,630.

More specifically, a θ stage is rotatably mounted on an X-Y stage, and this θ stage is equipped with an L-shaped mirror having two reflection surfaces (hereinafter "X mirror" and "Y mirror") elongating perpendicularly to the X and Y axes, respectively. One laser interferometer is disposed opposed to the Y mirror, for example, and two laser interferometers are juxtaposed with each other to be opposed to the other mirror (X mirror). Each laser interferometer is of well known type and serves to project a laser beam to an opposed mirror surface and to receive the laser beam reflected by the mirror surface. On the basis of a doppler shift caused by any change in position of the irradiated portion of the mirror surface in a direction along the laser beam, the laser interferometer detects the displacement of that portion of the mirror surface in the direction (X or Y axis direction) along the laser beam. From the outputs of the two laser interferometers disposed opposed to the X mirror, displacements X1 and X2 of two portions of the X mirror surface (irradiated by the two laser beams) in the X axis direction can be detected. Then, from these displacements, a yawing angle of the X mirror (i.e. θ stage) can be determined in accordance with an equation below:

$$\theta = \tan^{-1}(X1-X2)/D$$

where D is the interval of the two X axis side laser interferometers. Then, the θ table is rotationally moved to reduce the determined yawing angle to zero. This is called a "yawing correction". The X and Y axis positioning is carried out by using the output of one of the two laser interferometers opposed to the X mirror as well as the output of the laser interferometer opposed to the Y mirror, in a well known manner.

SUMMARY OF THE INVENTION

However, the inventors of the subject application have found specific inconveniences involved in such X-Y positioning system. In principle, these inconveniences are attributable to the surface precision of the mirror surface with which the yawing measurement is carried out. If, for example, a pair of laser interferometers are used in relation to the X mirror so as to project two laser beams thereupon, when the X-Y stage is moved in the X axis direction, any yawing can be measured exactly. However, when the stage is moved in the Y axis direction, with the Y axis movement the surface of the X mirror is scanned by the two laser beams from the two X axis laser interferometers. Namely, the position of incidence of each laser beam upon the X mirror surface changes in the Y axis direction with the Y axis movement of the X-Y stage. This causes a possibility of incorrect yawing measurement and control since, if the mirror surface has a curvature or the like, the distance from the laser interferometer to the X mirror surface changes with the Y axis movement of the stage and thus the outputs of the two X axis laser interferometers indicates some "yawing" regardless of holding constant of the attitude of the X-Y stage.

It is accordingly an object of the present invention to provide a position detecting system or a positioning system by which high precision yawing detection is assured regardless of the surface precision of a mirror.

It is another object of the present invention to provide an exposure apparatus using such a position detecting system or a positioning system.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 3 is a flow chart showing the flow of yawing measurement according to a further embodiment of the present invention.

DESCRIPTION OF THE PREFERRED EMBODIMENTS

Figure 1:
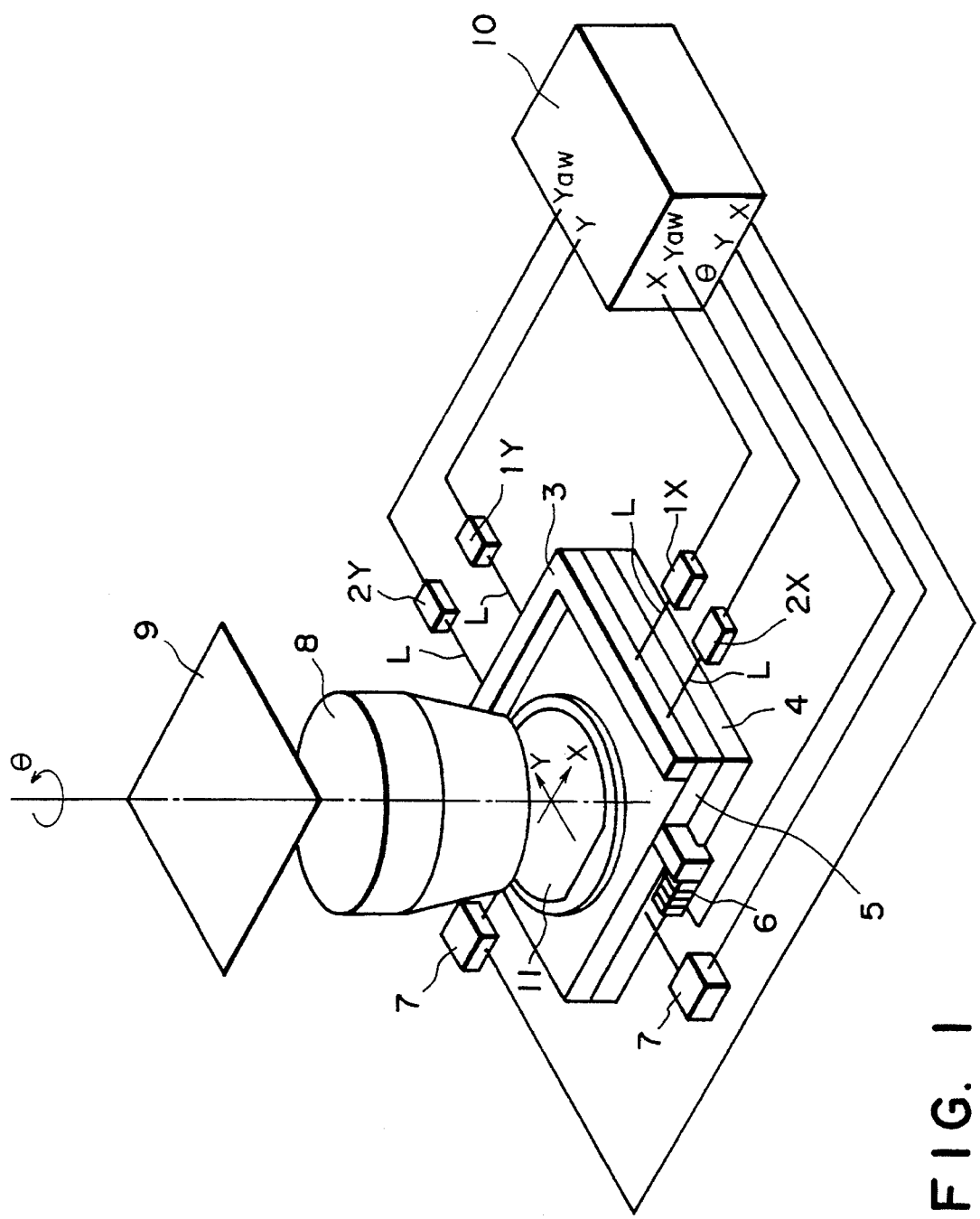
FIG. 1 is a schematic view of an exposure apparatus according to a first embodiment of the present invention.

FIG. 1 shows a first embodiment of the present invention when applied to a reduction projection exposure apparatus (stepper). Denoted at 8 is a projection lens system for projecting a pattern of a reticle 9 upon a wafer 11 in a reduced scale. All the components shown in FIG. 1, except for those described above, constitute a wafer stage system. The wafer stage system serves to position the wafer 11 in alignment with the reticle 9. After the reticle-to-wafer alignment is completed, the reticle 9 is illuminated with light from a light source (not shown), and the pattern (not shown) of the reticle 9 is projected on a radiation sensitive material on the wafer 11 by the projection lens system 8, whereby the reticle 9 pattern is printed on the wafer.

The wafer stage system includes a pair of laser interferometers 1X and 2X disposed opposed to one side surface of an L-shaped mirror 3, elongated perpendicular to the X axis, and another pair of laser interferometers 1Y and 2Y disposed opposed to the other side surface of the mirror 3, elongated perpendicular to the Y axis. Denoted at 4 is an X-Y table (stage), and denoted at 5 is a rotatable θ table. Denoted at 6 is a rotational drive mechanism which comprises a piezoelectric device, for example, for rotationally moving the θ table 5 relative to the X-Y table 4. Denoted at 7 is an X-Y drive (DC motor), and denoted at 10 is a control box which includes a driving circuit and so on. Characters L each depicts a laser beam. As understood, the paired laser interferometers 1X and 2X are related to the X axis, while the paired laser interferometers 1Y and 2Y are related to the Y axis.

In operation, the position of the X-Y stage in the X axis direction is measured by using the laser interferometer 1X, for example, and the position of the X-Y stage in the Y axis direction is measured by using the laser interferometer 1Y, for example, in a well known manner. The yawing measurement, with respect to the X axis movement, is carried out through the paired laser interferometers 1X and 2X, on the basis of a difference between the outputs thereof. With respect to the Y axis movement, the yawing measurement is carried out through the paired laser interferometers 1Y and 2Y, on the basis of a difference between the output thereof. The calculation and determination of yawing is carried out in the control box 10 and, based on this, the position and yawing control is performed.

In the present embodiment, as described, when the X-Y stage is moved in the X axis direction, the yawing measurement is carried out by using the pair of laser interferometers 1X and 2X. On the other hand, for the Y axis movement of the X-Y stage, the yawing measurement is carried out by using the other pair of laser interferometers 1Y and 2Y. By such independent yawing control with respect to the X axis and Y axis movements, it is possible to completely avoid any effect of the surface precision of the mirror surface. Therefore, the present invention in this aspect assures high precision positioning control and, thus, the arrangement of the present embodiment is quite effective for use in a semiconductor exposure apparatus (stepper), for example.

Figure 2:
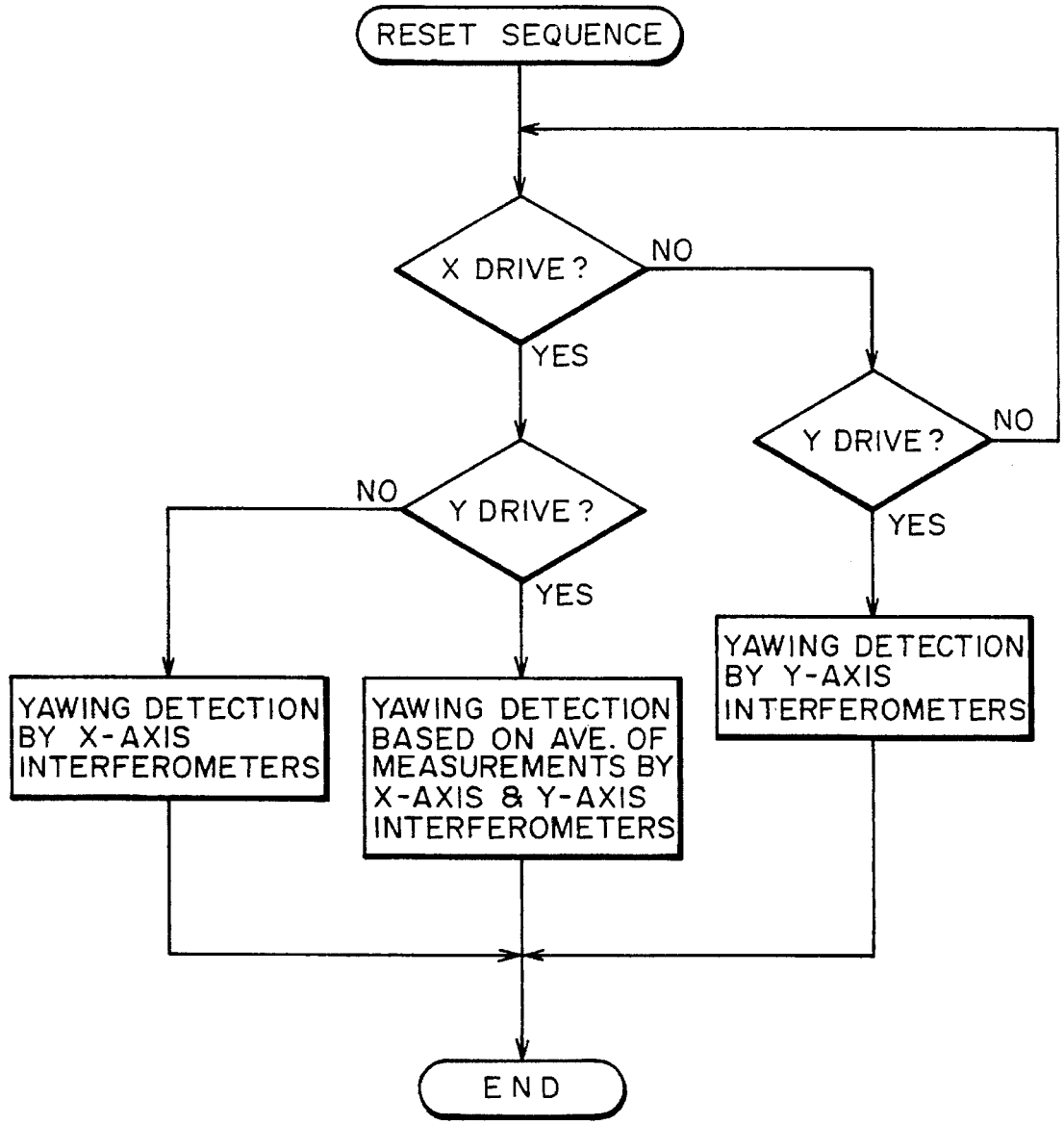
FIG. 2 is a flow chart showing the flow of yawing measurement according to a second embodiment of the present invention.

A second embodiment of the present invention will now be explained by reference to the flow chart of FIG. 2 and to the arrangement shown in FIG. 1.

In this embodiment, when in operation the X-Y table 5 is to be moved only in the X axis direction, the quantity and direction of any yawing of the X-Y table during the X axis movement is detected from a difference between the displacements as measured through the X axis laser interferometers 1X and 2X. The yawing calculation and determination is carried out in the control box 10. When, on the other hand, the X-Y table is to be moved only in the Y axis direction, the quantity and direction of any yawing of the X-Y stage is detected by using the Y axis laser interferometers 1Y and 2Y, in a similar manner.

When the X-Y table 5 is to be moved in both the X axis and Y axis directions successively or simultaneously, in the present embodiment, first the difference between the displacements measured through the X axis laser interferometers 1X and 2X as well as the difference between the displacements measured through the Y axis laser interferometers 1Y and 2Y are detected. Then, an average of these two differences is calculated and, from the obtained average, the quantity and direction of the yawing of the X-Y stage is determined. Based on this, the yawing control is made by adjusting the rotational position of the θ table.

It is possible in the present embodiment that, where the X-Y table is moved first in the X axis direction and then in the Y axis direction, for example, the outputs of the X axis laser interferometers 1X and 2X as the X axis movement is just completed do not indicate occurrence of yawing while, on the other hand, the outputs of the Y axis laser interferometer (not used for the yawing detection at this moment) shows a certain difference indicating the occurrence of yawing. Clearly, such a difference in the outputs of the Y axis laser interferometers results from an error in the surface shape of the reflection mirror opposed to the Y axis laser interferometers. In consideration of this, if such a difference is produced, it may be used as an offset for the yawing detection to be made in the subsequent Y axis movement, which offset may be subtracted from a difference between the outputs of the Y axis laser interferometers as the Y axis movement is completed.

A third embodiment of the present invention will now be explained.

In this embodiment, yawing measuring means such as described with reference to the foregoing embodiments is used, but the operation of such means is different. In the present embodiment, when the X-Y table is moved in the X axis direction, for example, the yawing is measured in respect to the X axis direction in the manner as described above and, also, with respect to the Y axis direction by using the Y axis laser interferometers. By correcting the measured Y axis yawing level by using the measured X axis yawing level, it is possible to determine the surface precision of the Y axis mirror surface (i.e. yawing detection errors at each position on the Y axis mirror surface). The measured Y axis yawing level may be stored in into a memory for use as a corrective value, to be used with appropriate software. If this is done, then the subsequent yawing control can be made along both the X and Y axes with only one pair of laser interferometers (X axis laser interferometers in this case), without being affected by the surface precision of the mirror.

Figure 4:
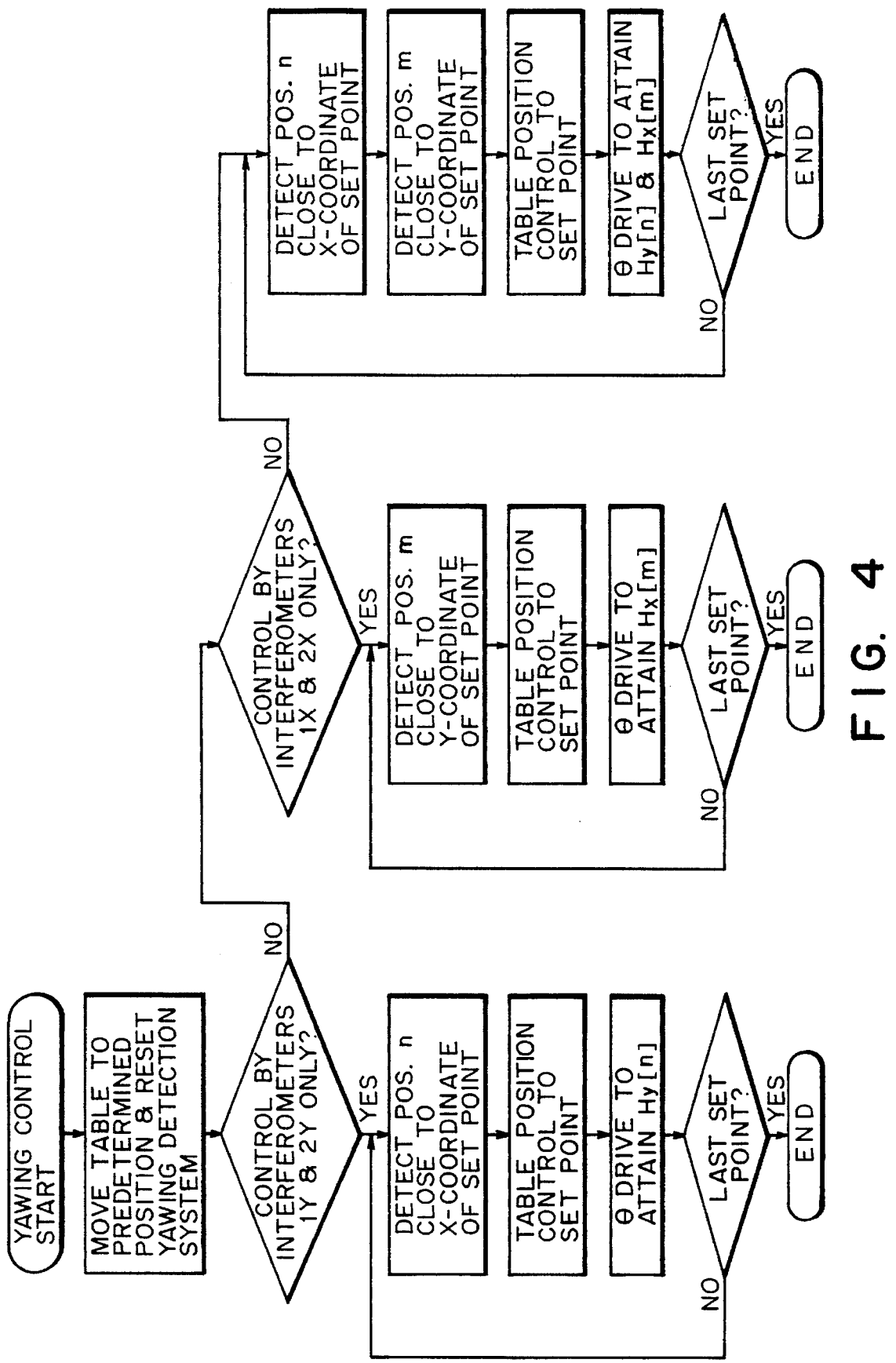
FIG. 4 is a flow chart showing the flow of yawing control based on the yawing measurement according to the FIG. 3 embodiment.

A fourth embodiment of the present invention will now be explained with reference to FIGS. 3 and 4.

In this embodiment, the surface shape error measurement is made with respect to each of the X mirror surface and the Y mirror surface of the L-shaped mirror.

First, as regards the Y mirror surface opposed to the Y axis laser interferometers 1Y and 2Y, a surface shape error is measured. To this end, the X-Y table 5 is moved to such position at which the laser beam from one of the interferometers 1Y and 2Y impinges on an end of the effective area of the Y mirror. Then, the yawing measuring means is reset such that it is now prepared for subsequent yawing measurement by using a current output of each interferometer as a reference level. Thereafter, the X-Y table is moved in the X axis direction to such position at which the laser beam from the other Y axis laser interferometer 2Y or 1Y impinges on the other end of the effective area of the Y mirror. During this X axis movement, the position (n-th position) of the X-Y table 5 in the X axis direction is continuously monitored through the X axis interferometer 1X. Simultaneously, at each of successive X axis positions, the yawing level $Qx(n)$ of the X-Y table as measured through the interferometers 1X and 2X as well as the yawing level $Qy(n)$ as measured through the interferometers 1Y and 2Y, are monitored and stored in into a memory. Since the monitored yawing level $Qx(n)$ does not contain an error in regard to the yawing measurement, the difference between the yawing levels Qx(n) and Qy(n), that is, Hy[n]=Qy(n)−Qx(n), corresponds to an error component at the n-th position in the X axis direction of the X-Y table 5 (the error component results from the surface shape of the Y mirror). Thus, the difference Hy[n] can be used as a corrective value. This error determination is made for the entire X axis range of the Y mirror.

After this, the surface shape error measurement is made to the X mirror opposed to the X axis laser interferometers 1X and 2X, in a similar manner. Thus, for each m-th position, a corrective value Hx[m]=Qx(m)−Qy(m) is determined, and this is made for the entire Y axis range of the X mirror.

The yawing control based on such measured surface precision will now be explained in conjunction with the flow chart of FIG. 4.

First, the X-Y table 5 is moved to a predetermined position (home position), and then the yawing measuring means is reset. Then, whether for the yawing measurement only the pair of interferometers 1Y and 2Y or only the pair of interferometers 1X and 2X are to be used or whether all of these interferometers are to be used, is determined. This may be done by an operator's selection. If the interferometers 1Y and 2Y are to be used, such an n-th position (one of the positions with respect to which the surface shape error measurement has been made in the flow chart of FIG. 3) closest to or corresponding to the X coordinate of a set position for the positioning of the X-Y table, is determined. Then, as the X-Y table 5 is positioned at this set position, the rotational drive mechanism 6 is so controlled that the interferometers 1Y and 2Y produce outputs representing a yawing level corresponding to a corrective level Hy[n] in respective to the n-th position, having been stored.

If the interferometers 1X and 2X are to be used, similar operations are made with regard to an m-th position as described.

Where all the interferometers 1X, 2X, 1Y and 2Y are to be used, the rotational drive mechanism 6 is so controlled that the pairs of interferometers produce outputs representing yawing levels of Hy[n] and Hx[m], respectively. If Hy[n] and Hx[m] are not produced at the same time, then the rotational drive mechanism 6 is so controlled that the difference between Hy[n] and the yawing level represented by the outputs of the interferometers 1Y and 2Y becomes substantially equal to the difference between Hx[m] and the yawing level represented by the outputs of the interferometers 1X and 2X. Alternatively, in such a case, an alarm may be produced to interrupt the positioning operation.

In the preceding embodiments, the X axis position or the Y axis position of the X-Y table is detected through one (1X or 1Y) of the paired interferometers. However, both of the paired laser interferometers may be used for this purpose, and the X axis or Y axis position may be detected on the basis of an average of displacements measured through the paired interferometers 1X and 2X (or 1Y and 2Y).

Figure 5:
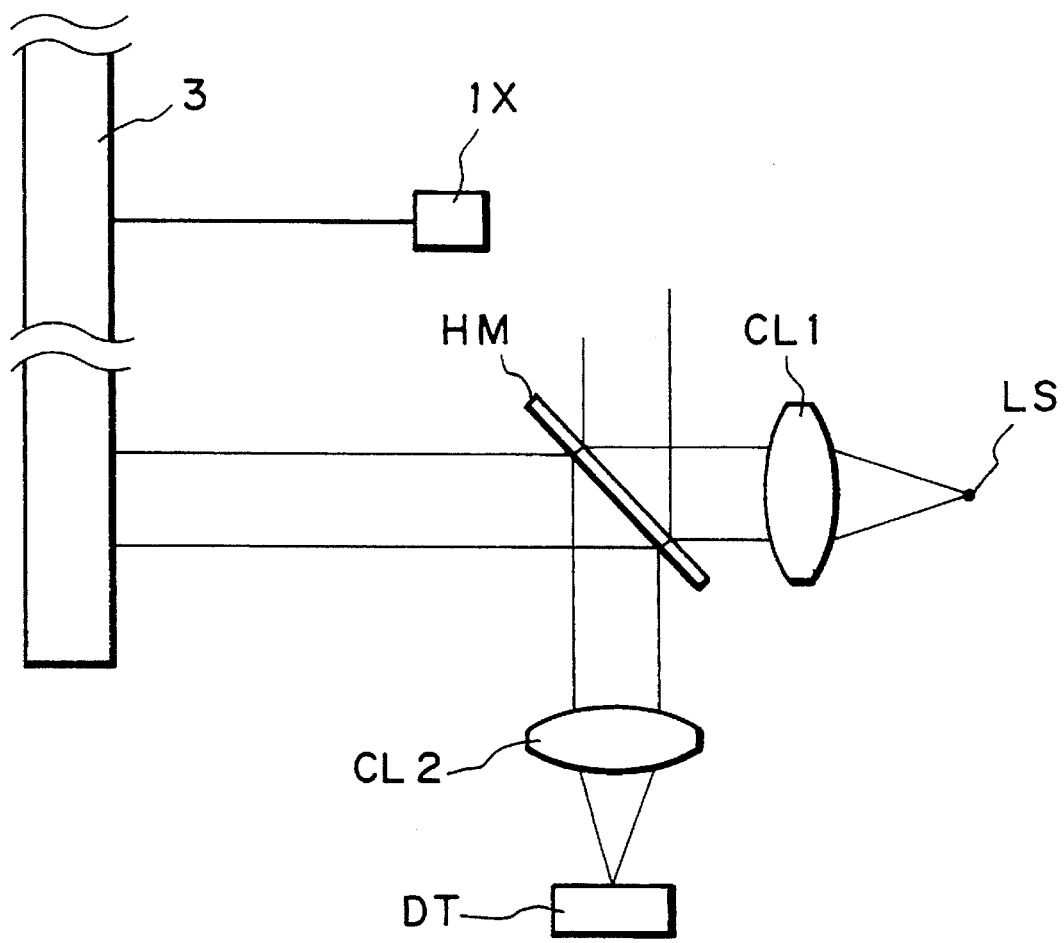
FIG. 5 is a fragmentary view, schematically showing a position detecting system according to a still further embodiment of the present invention.

The laser interferometers 2X and 2Y of the yawing measuring means, for example, may be replaced by collimators to be provided in relation to the X and Y axes (X and Y mirrors), respectively and independently of each other. Such an embodiment is shown in FIG. 5. In FIG. 5, only a collimator disposed opposed to the X mirror is illustrated.

Each collimator itself is of a known type. Light emanating from a light source LS is collimated by a first collimator lens CL1 into a parallel light which then goes through a half mirror HM and impinges on the mirror 3. The light is reflected by the mirror 3 surface and a portion thereof is then reflected by the half mirror HM. The reflected light is collected by a second collimator lens CL2 and then is received by a detector DT such as a PSD sensor, for example.

If the angle of the mirror 3 changes, the position of incidence of the light impinging on the detector DT shifts. Thus, by detecting the position of incidence of the light on the detector DT, any change in the angle of the mirror 3 surface can be detected.

In this embodiment, the control box 10 operates so that it determines the yawing of the X-Y table only on the basis of the output of one of or both of the X axis collimator and the Y axis collimator, without using the outputs of the laser interferometer 1X or 1Y. Namely, in this embodiment, the interferometers 1X and 1Y are used only for the X and Y axis positioning. The yawing control may be made essentially in the same manner as has been described with reference to the foregoing embodiments.

In accordance with the present invention, as described hereinbefore, it is possible to provide a high precision position detecting system or positioning system and, therefore, it is possible to provide an exposure apparatus such as a stepper having high pattern superposition precision and high productivity.

While the invention has been described with reference to the structures disclosed herein, it is not confined to the details set forth and this application is intended to cover such modifications or changes as may come within the purposes of the improvements or the scope of the following claims.

What is claimed is:

1. A device for producing positional information related to a position of an article, comprising:

first detecting means, disposed to be opposed to a first surface of the article, for producing a first output related to a position, in a first direction, of a first portion of the first surface of the article opposed to said first detecting means;

second detecting means, disposed to be opposed to the first surface of the article, for producing a second output related to a position, in the first direction, of a second portion of the first surface of the article opposed to said second detecting means;

third detecting means disposed to be opposed to a second surface of the article, different from the first surface, for producing a third output related to a position, in a second direction intersecting the first direction, of a first portion of the second surface of the article opposed to said third detecting means;

fourth detecting means, disposed to be opposed to the second surface of the article, for producing a fourth output related to a position, in the second direction, of a second portion of the second surface of the article opposed to said fourth detecting means; and processing means for producing first positional information related to a position of the article in the first direction on the basis of at least one of the first and second outputs of said first and second detecting means, and for producing second positional information related to a position of the article in the second direction on the basis of at least one of the third and fourth outputs of said third and fourth detecting means, said processing means further being operable to detect rotation of the article along a plane including the first and second directions on the basis of the first and second outputs of said first and second detecting means and also to detect rotation of the article along a plane including the first and second directions on the basis of the third and fourth outputs of said third and fourth detecting means, wherein said processing means corrects the rotation of the article along a plane including the first and second directions on the basis of the first and second outputs of said first and second detecting means when the article is moved only in the first direction, while said processing means corrects the rotation of the article along a plane including the first and second directions on the basis of the third and fourth outputs of said third and fourth detecting means when the article is moved only in the second direction.

2. A device according to claim 1, wherein said processing means is further operable to detect rotation of the article on the basis of averaging the detection through said first and second detecting means and the detection through said third and fourth detecting means when the object to be measured moves in the first and second directions at once.

3. A device according to claim 1, wherein each of said first, second, third, and fourth detecting means includes a laser interferometer.

4. A device according to claim 3, wherein said laser interferometers of said first and second detecting means each projects a laser beam to the first surface of the article along the first direction, and wherein said laser interferometers of said third and fourth detecting means each projects a laser beam to the second surface of the article along the second direction.

5. A device for producing positional information related to a position of an article, comprising:

first detecting means, disposed to be opposed to a first surface of the article, for producing a first output related to a position, in a first direction, of a first portion of the first surface of the article opposed to said first detecting means;

second detecting means, disposed to be opposed to the first surface of the article, for producing a second output related to a position, in the first direction, of a second portion of the first surface of the article opposed to said second detecting means;

third detecting means disposed to be opposed to a second surface of the article, different from the first surface, for producing a third output related to a position, in a second direction intersecting the first direction, of a first portion of the second surface of the article opposed to said third detecting means;

fourth detecting means, disposed to be opposed to the second surface of the article, for producing a fourth output related to a position, in the second direction, of a second portion of the second surface of the article opposed to said fourth detecting means; and processing means for producing first positional information related to a position of the article in the first direction on the basis of at least one of the first and second outputs of said first and second detecting means, and for producing second positional information related to a position of the article in the second direction on the basis of at least one of the third and fourth outputs of said third and fourth detecting means, said processing means further being operable to detect rotation of the article along a plane including the first and second directions on the basis of the first and second outputs of said first and second detecting means and also to detect rotation of the article along a plane including the first and second directions on the basis of the third and fourth outputs of said third and fourth detecting means, wherein said processing means is further operable, when the article is moved only in the first direction, to detect an error in the detection of rotation of the article along a plane including the first and second directions through said third and fourth detecting means, on the basis of the difference between the result of detection through said first and second detecting means and the result of detection through said third and fourth detecting means.

6. A device according to claim 5, wherein said processing means is operable to detect the rotation of the second surface of the article through said third and fourth detecting means on the basis of the detected error.

7. A device according to claim 5, wherein each of said first to fourth detecting means includes a laser interferometer.

8. An apparatus for transferring a pattern of an original to a photosensitive member, comprising:

transfer means for transferring the pattern of the original to the photosensitive member;

a movable member movable for alignment of the original and the photosensitive member;

a reference member providing a reference for the alignment of the original and the photosensitive member, said reference member being provided on said movable member;

first detecting means, disposed to be opposed to a first surface of the reference member, for producing a first output related to a position, in a first direction, of a first portion of the first surface of said reference member opposed to said first detecting means;

second detecting means, disposed to be opposed to the first surface of said reference member, for producing a second output related to a position, in the first direction, of a second portion of the first surface of said reference member opposed to said second detecting means;

third detecting means, disposed to be opposed to a second surface of said reference member, different from the first surface, for producing a third output related to a position, in a second direction intersecting the first direction, of a first portion of the second surface of said reference member opposed to said third detecting means;

fourth detecting means, disposed to be opposed to the second surface of said reference member, for producing a fourth output related to a position, in the second direction, of a second portion of the second surface of said reference member opposed to said fourth detecting means;

processing means for producing first positional information related to a position of said reference member in the first direction on the basis of at least one of the first and second outputs of said first and second detecting means, and for producing second positional information related to a position of said reference member in the second direction on the basis of at least one of the third and fourth outputs of said third and fourth detecting means, said processing means further being operable to detect rotation of the reference member along a plane including the first and second directions on the basis of the first and second outputs of said first and second detecting means and also to detect rotation of the reference member along a plane including the first and second directions on the basis of the third and fourth outputs of said third and fourth detecting means; and driving means for moving said movable member for the alignment of the original and the photosensitive member on the basis of at least one of the detections by said processing means, wherein said processing means corrects rotation of said movable member on the basis of detection of the rotation of the reference member along a plane including the first and second directions through the first and second outputs of said first and second detecting means when the movable member is moved by said driving means only in the first direction, while said processing means corrects rotation of said movable member on the basis of detection of the rotation of the reference member along a plane including the first and second directions through the third and fourth outputs of said third and fourth detecting means when said movable member is moved by said driving means only in the second direction.

9. An apparatus according to claim 8, wherein said processing means is further operable to detect rotation of said movable member on the basis of averaging the detection through said first and second detecting means and the detection through said third and fourth detecting means when the object to be measured moves in the first and second directions at once.

10. An apparatus according to claim 8, wherein each of said first, second, third, and fourth detecting means includes a laser interferometer.

11. An apparatus according to claim 10, wherein said laser interferometers of said first and second detecting means each projects a laser beam to the first surface of said reference member along the first direction, and wherein said laser interferometers of said third and fourth detecting means each projects a laser beam to the second surface of said reference member along the second direction.

12. An apparatus for transferring a pattern of an original to a photosensitive member, comprising:

transfer means for transferring the pattern of the original to the photosensitive member;

a movable member movable for alignment of the original and the photosensitive member;

a reference member providing a reference for the alignment of the original and the photosensitive member, said reference member being provided on said movable member;

first detecting means, disposed to be opposed to a first surface of the reference member, for producing a first output related to a position, in a first direction, of a first portion of the first surface of said reference member opposed to said first detecting means;

second detecting means, disposed to be opposed to the first surface of said reference member, for producing a second output related to a position, in the first direction, of a second portion of the first surface of said reference member opposed to said second detecting means;

third detecting means, disposed to be opposed to a second surface of said reference member, different from the first surface, for producing a third output related to a position, in a second direction intersecting the first direction, of a first portion of the second surface of said reference member opposed to said third detecting means;

fourth detecting means, disposed to be opposed to the second surface of said reference member, for producing a fourth output related to a position, in the second direction, of a second portion of the second surface of said reference member opposed to said fourth detecting means;

processing means for producing first positional information related to a position of said reference member in the first direction on the basis of at least one of the first and second outputs of said first and second detecting means, and for producing second positional information related to a position of said reference member in the second direction on the basis of at least one of the third and fourth outputs of said third and fourth detecting means, said processing means further being operable to detect rotation of the reference member along a plane including the first and second directions on the basis of the first and second outputs of said first and second detecting means and also to detect rotation of the reference member along a plane including the first and second directions on the basis of the third and fourth outputs of said third and fourth detecting means; and driving means for moving said movable member for the alignment of the original and the photosensitive member on the basis of at least one of the detections by said processing means, wherein said processing means is further operable, when said reference member is moved only in the first direction, to detect an error in the detection of rotation of the reference member along a plane including the first and second directions through said third and fourth detecting means, on the basis of the difference between the result of detection through said first and second detecting means and the result of detection through said third and fourth detecting means.

13. An apparatus according to claim 12, wherein said driving means rotationally drives said movable member on the basis of the detected error and the detection through said third and fourth detecting means.

14. An apparatus according to claim 12, wherein each of said first to fourth detecting means includes a laser interferometer.

15. A device for producing position information related to a position of an article, comprising:

a first laser interferometer for projecting a first laser beam to a first surface of the article and producing a first output related to a position, in a first direction, of a first portion of the first surface of the article irradiated with the first laser beam from said first laser interferometer;

a second laser interferometer for projecting a first laser beam to the first surface of the article and producing a second output related to a position, in the first direction, of a second portion of the first surface of the article irradiated with the second laser beam from said second laser interferometer;

a third laser interferometer for projecting a third laser beam to a second surface of the article, different from the first surface, and producing a third output related to a position, in a second direction intersecting the first direction, of a first portion of the second surface of the article irradiated with the third laser beam from said third laser interferometer;

a fourth laser interferometer for projecting a fourth laser beam to the second surface of the article and producing a fourth output related to a position, in the second direction, of a second portion of the second surface of the article irradiated with the fourth laser beam from said fourth laser interferometer; and processing means for producing first positional information related to a position of the article in the first direction on the basis of at least one of the first and second outputs of said first and second laser interferometers, and for producing second positional information related to a position of the article in the second direction on the basis of at least one of the third and fourth outputs of said third and fourth laser interferometers, said processing means further being operable to detect rotation of the article along a plane including the first and second directions on the basis of the first and second outputs of said first and second laser interferometers and also to detect rotation of the article along a plane including the first and second directions on the basis of the third and fourth outputs of said third and fourth laser interferometers, wherein said processing means corrects the rotation of the article along a plane including the first and second directions on the basis of the first and second outputs of said first and second laser interferometers when the article is moved only in the first direction, while said processing means corrects the rotation of the article along a plane including the first and second directions on the basis of the third and fourth outputs of said third and fourth laser interferometers when the article is moved only in the second direction.

16. A device according to claim 15, wherein said processing means is further operable to detect rotation of the article on the basis of averaging the detection through said first and second laser interferometers and the detection through said third and fourth laser interferometers when the object to be measured moves in the first and second directions at once.

17. A device for producing positional information related to a position of an article, comprising:

a first laser interferometer for projecting a first laser beam to a first surface of the article and producing a first output related to a position, in a first direction, of a first portion of the first surface of the article irradiated with the first laser beam from said first laser interferometer;

a second laser interferometer for projecting a second laser beam to the first surface of the article and producing a second output related to a position, in the first direction, of a second portion of the first surface of the article irradiated with the second laser beam from said second laser interferometer;

a third laser interferometer for projecting a third laser beam to a second surface of the article, different from the first surface, for producing a third output related to a position, in a second direction intersecting the first direction, of a first portion of the second surface of the article irradiated with the third laser beam from said third laser interferometer;

a fourth laser interferometer for projecting a fourth laser beam to the second surface of the article and producing a fourth output related to a position, in the second direction, of a second portion of the second surface of the article irradiated with the fourth laser beam from said fourth laser interferometer; and processing means for producing first positional information related to a position of the article in the first direction on the basis of at least one of the first and second outputs of said first and second laser interferometers, and for producing second positional information related to a position of the article in the second direction on the basis of at least one of the third and fourth outputs of said third and fourth laser interferometers, said processing means further being operable to detect rotation of the article along a plane including the first and second directions on the basis of the first and second outputs of said first and second laser interferometers and also to detect rotation of the article along a plane including the first and second directions on the basis of the third and fourth outputs of said third and fourth laser interferometers, wherein said processing means is further operable, when the article is moved only in the first direction, to detect an error in the detection of rotation of the article along a plane including the first and second directions through said third and fourth laser interferometers, on the basis of the difference between the result of detection through said first and second laser interferometers and the result of detection through said third and fourth laser interferometers.

18. A device according to claim 17, wherein said processing means is operable to detect the rotation of the second surface of the article through said third and fourth laser interferometers on the basis of the detected error.

19. An apparatus for transferring a pattern of an original to a photosensitive member, comprising:

a lens for transferring the pattern of the original to the photosensitive member;

a movable member movable for alignment of the original and the photosensitive member;

an L-shaped mirror provided on said movable member and having first and second reflection surfaces elongated perpendicular to first and second intersecting directions, respectively;

a first laser interferometer for projecting a first laser beam to the first reflection surface of the mirror and producing a first output related to a position, in the first direction, of a first portion of the first reflection surface of said mirror irradiated with the first laser beam from said first laser interferometer;

a second laser interferometer for projecting a second laser beam to the first reflection surface of the mirror and producing a second output related to a position, in the first direction, of a second portion of the first reflection surface of said mirror irradiated with the second laser beam from said second laser interferometer;

a third laser interferometer for projecting a third laser beam to the second reflection surface of said mirror, for producing a third output related to a position, in the second direction, of a first portion of the second reflection surface of said mirror irradiated with the third laser beam from said third laser interferometer;

a fourth laser interferometer for projecting a fourth laser beam to the second reflection surface of said mirror and producing a fourth output related to a position, in the second direction, of a second portion of the second reflection surface of said mirror irradiated with the fourth laser beam from said fourth laser interferometer;

processing means for producing first positional information related to a position of said mirror in the first direction on the basis of at least one of the first and second outputs of said first and second laser interferometers, and for producing second positional information related to a position of said mirror in the second direction on the basis of at least one of the third and fourth outputs of said third and fourth laser interferometers, said processing means further being operable to detect rotation of the mirror along a plane including the first and second directions on the basis of the first and second outputs of said first and second laser interferometers and also to detect rotation of the mirror along a plane including the first and second directions on the basis of the third and fourth outputs of said third and fourth laser interferometers; and driving means for moving said movable member for alignment of the original and the photosensitive member on the basis of at least one of the detections by said processing means, wherein said processing means corrects rotation of said movable member on the basis of detection of the rotation of the mirror along a plane including the first and second directions through the first and second outputs of said first and second laser interferometers when said movable member is moved by said driving means only in the first direction, while said processing means corrects rotation of said movable member on the basis of detection of the rotation of the mirror along a plane including the first and second directions through the third and fourth outputs of said third and fourth laser interferometers when said movable member is moved by said driving means only in the second direction.

20. A device according to claim 19, wherein said processing means is further operable to detect rotation of said movable member on the basis of averaging the detection through said first and second laser interferometers and the detection through said third and fourth laser interferometers when the object to be measured moves in the first and second directions at once.

21. A device for producing positional information related to a position of an article, comprising:

a lens for transferring the pattern of the original to the photosensitive member;

a movable member movable for alignment of the original and the photosensitive member;

an L-shaped mirror provided on said movable member and having first and second reflection surfaces elongated perpendicular to first and second intersecting directions, respectively;

a first laser interferometer for projecting a first laser beam to the first reflection surface of the mirror and producing a first output related to a position, in the first direction, of a first portion of the first reflection surface of said mirror irradiated with the first laser beam from said first laser interferometer;

a second laser interferometer for projecting a second laser beam to the first reflection surface of the mirror and producing a second output related to a position, in the first direction, of a second portion of the first reflection surface of said mirror irradiated with the second laser beam from said second laser interferometer;

a third laser interferometer for projecting a third laser beam to the second reflection surface of said mirror, for producing a third output related to a position, in the second direction, of a first portion of the second reflection surface of said mirror irradiated with the third laser beam from said third laser interferometer;

a fourth laser interferometer for projecting a fourth laser beam to the second reflection surface of said mirror and producing a fourth output related to a position, in the second direction, of a second portion of the second reflection surface of said mirror irradiated with the fourth laser beam from said fourth laser interferometer;

processing means for producing first positional information related to a position of said mirror in the first direction on the basis of at least one of the first and second outputs of said first and second laser interferometers, and for producing second positional information related to a position of said mirror in the second direction on the basis of at least one of the third and fourth outputs of said third and fourth laser interferometers, said processing means further being operable to detect rotation of the mirror along a plane including the first and second directions on the basis of the first and second outputs of said first and second laser interferometers and also to detect rotation of the mirror along a plane including the first and second directions on the basis of the third and fourth outputs of said third and fourth laser interferometers; and driving means for moving said movable member for alignment of the original and the photosensitive member on the basis of at least one of the detections by said processing means, wherein said processing means is further operable, when said mirror is moved only in the first direction, to detect an error in the detection of rotation of the mirror along a plane including the first and second directions through said third and fourth laser interferometers, on the basis of the difference between the result of detection through said first and second laser interferometers and the result of detection through said third and fourth laser interferometers.

22. A device according to claim 21, wherein said driving means rotationally drives said movable member on the basis of the detected error and the detection through said third and fourth laser interferometers.

* * * * *

UNITED STATES PATENT AND TRADEMARK OFFICE
CERTIFICATE OF CORRECTION

PATENT NO. : 5,523,843
DATED : June 4, 1996
INVENTOR(S) : YUKIO YAMANE, ET AL.

It is certified that error appears in the above-indentified patent and that said Letters Patent is hereby corrected as shown below:

<u>Column 1,</u>
    line 16, "article, to" should read --article to--.
    line 21, "in" should read --projected along--.

<u>Column 4,</u>
    line 65, "into" should be deleted.

<u>Column 5,</u>
    line 31, "respective" should read --respect--.

Signed and Sealed this

Seventh Day of July, 1998

Attest:

BRUCE LEHMAN

*Attesting Officer*     *Commissioner of Patents and Trademarks*